(12) United States Patent
Takeuchi et al.

(10) Patent No.: US 7,482,734 B2
(45) Date of Patent: Jan. 27, 2009

(54) PIEZOELECTRIC/ELECTROSTRICTIVE DEVICE AND METHOD OF DRIVING PIEZOELECTRIC/ELECTROSTRICTIVE DEVICE

(75) Inventors: Yukihisa Takeuchi, Nagoya (JP); Koji Ikeda, Tsu (JP); Kazuyoshi Shibata, Mizunami (JP)

(73) Assignee: NGK Insulators, Ltd., Nagoya (JP)

( * ) Notice: Subject to any disclaimer, the term of this patent is extended or adjusted under 35 U.S.C. 154(b) by 69 days.

(21) Appl. No.: 11/566,380

(22) Filed: Dec. 4, 2006

(65) Prior Publication Data

US 2007/0132340 A1 Jun. 14, 2007

(30) Foreign Application Priority Data

Dec. 8, 2005 (JP) ............... 2005-355471

(51) Int. Cl.
*H01L 41/08* (2006.01)
(52) U.S. Cl. ...................................... 310/331
(58) Field of Classification Search .......... 310/330–333
See application file for complete search history.

(56) References Cited

U.S. PATENT DOCUMENTS

| | | | | |
|---|---|---|---|---|
| 2,515,446 A | * | 7/1950 | Gravley | ............ 310/330 |
| 3,416,367 A | * | 12/1968 | Ernst | ............... 73/83 |
| 4,170,397 A | * | 10/1979 | Botcherby et al. | ........ 359/210 |
| 5,705,878 A | * | 1/1998 | Lewis et al. | ........ 310/328 |
| 6,262,516 B1 | * | 7/2001 | Fukuda et al. | ........ 310/328 |
| 6,501,210 B1 | * | 12/2002 | Ueno | ........ 310/331 |
| 6,538,854 B2 | * | 3/2003 | Koganezawa et al. | .... 360/294.4 |
| 6,657,764 B1 | * | 12/2003 | Smits | ........ 359/224 |
| 6,692,422 B2 | * | 2/2004 | Yamaguchi et al. | ........ 492/56 |
| 6,940,210 B2 | * | 9/2005 | Karrai et al. | ........ 310/328 |
| 7,024,739 B2 | * | 4/2006 | Ikeda et al. | ........ 29/25.35 |
| 7,075,212 B2 | * | 7/2006 | Witteveen | ........ 310/323.02 |
| 2003/0071541 A1 | * | 4/2003 | Mita et al. | ........ 310/328 |
| 2006/0280421 A1 | * | 12/2006 | Tanaka et al. | ........ 385/140 |
| 2007/0228881 A1 | * | 10/2007 | Hida et al. | ........ 310/328 |

FOREIGN PATENT DOCUMENTS

JP 2002-026411 A1 1/2002

* cited by examiner

*Primary Examiner*—Thomas M Dougherty
(74) *Attorney, Agent, or Firm*—Burr & Brown (57) ABSTRACT

A piezoelectric/electrostrictive device is provided, including a rotor substantially in the form of a rectangular parallelepiped. The rotor has a pair of opposed surfaces, a first movable section fixed to a first end of one of the surfaces, a first piezoelectric/electrostrictive element for actuating the first movable section, and a second movable section fixed to a second end of the other one of the surfaces. The second end is diametrically opposed to the first end. A second piezoelectric/electrostrictive element for actuating the second movable section is also included.

8 Claims, 7 Drawing Sheets

PIEZOELECTRIC/ELECTROSTRICTIVE DEVICE AND METHOD OF DRIVING PIEZOELECTRIC/ELECTROSTRICTIVE DEVICE

CROSS-REFERENCE TO RELATED APPLICATION

This application is based upon and claims the benefit of priority from Patent Application No. 2005-355471 filed on Dec. 8, 2005, in the Japanese Patent Office, of which the contents are incorporated herein by reference.

BACKGROUND OF THE INVENTION

1. Field of the Invention

The present invention relates to a piezoelectric/electrostrictive device having a rotor which rotates based on displacement of a piezoelectric/electrostrictive element or a piezoelectric/electrostrictive device for detecting angular displacement of a rotor with a piezoelectric/electrostrictive element, and a method of driving such a piezoelectric/electrostrictive device, and more particularly to a piezoelectric/electrostrictive device and a method of driving a piezoelectric/electrostrictive device, for use in controlling an actuator for positional control of a hard disk drive (HDD), controlling the angle of a small reflecting mirror, controlling the rotation of an antenna, controlling the θ-axis of an XY stage, and controlling the rotation of a manipulator.

2. Description of the Related Art

Recently, optical, magnetic recording, and precision machining fields have been in need of displacement elements capable of adjusting optical path lengths and positions in a range of submicrons. The development of displacement elements which utilize displacement based on an inverse piezoelectric effect or an electrostrictive effect that is caused when a voltage is applied to a piezoelectric/electrostrictive material such as a ferroelectric substance is under way.

Conventional piezoelectric actuators are problematic in that the movable section thereof moves a small distance because the displacement of a piezoelectric/electrostrictive material as it is expanded or contracted is directly transferred to the movable section.

There has been proposed a piezoelectric/electrostrictive device having a long service life, which can be handled better, allows a component to be mounted easily on the movable section thereof, and can be fixed securely in position. For details, reference should be made to Japanese Laid-Open Patent Publication No. 2002-26411, for example. The disclosed piezoelectric/electrostrictive device permits the movable section to be displaced a large distance under a relatively low voltage applied thereto, allows the device, particularly the movable section to be displaced at a high speed, i.e., at a high resonant frequency. The disclosed piezoelectric/electrostrictive device can provide a displacement element which is not susceptible to harmful vibrations, can respond at a high speed, has high mechanical strength, can be handled better, and is highly resistant to shocks and humidity, and also can provide a sensor element which is capable of detecting movable section vibrations with good accuracy.

When an object is to be moved, there is a demand for moving the object with a rotary motion. For example, perpendicular recording hard disk drives incorporate a magnetic head positioning mechanism which is required to make a rotary motion. The development of a highly responsive fine angle adjustment control device has been expected.

When an object is moved to make a rotary motion, it is preferable to minimize vibrations of the object and to prevent stresses caused by the rotary motion from being transferred to a control system to control the object with high accuracy.

SUMMARY OF THE INVENTION

It is an object of the present invention to provide a piezoelectric/electrostrictive device which reduces the movement of the center of gravity of an object at the time the object is moved, reduces reactive forces generated in a region where the piezoelectric/electrostrictive device is fixed, allows an easy control process to be performed for driving the object, and increases the driving frequency, i.e., the response speed, and a method of driving such a piezoelectric/electrostrictive device.

According to the present invention, there is provided a piezoelectric/electrostrictive device comprising a rotor substantially in the form of a rectangular parallelepiped. The rotor has a pair of opposed surfaces, a first movable section fixed to a first end of one of the surfaces, and a first piezoelectric/electrostrictive element for actuating the first movable section. The piezoelectric/electrostrictive device also includes a second movable section fixed to a second end of the other one of the surfaces of the rotor, where the second end is diametrically opposed to the first end. A second piezoelectric/electrostrictive element is also included for actuating the second movable section.

The first piezoelectric/electrostrictive element may serve as the first movable section, and the second piezoelectric/electrostrictive element may serve as the second movable section.

With the above arrangement, the two movable sections, i.e., the first movable section and the second movable section, sandwich the rotor, and are actuated by the respective piezoelectric/electrostrictive elements, i.e., the first piezoelectric/electrostrictive element and the second piezoelectric/electrostrictive element so as to rotate the rotor.

Specifically, the first movable section is fixed to the first end of the one of the surfaces of the rotor, and the second movable section is fixed to the second end, which is diametrically opposite to the first end, of the other one of the surfaces of the rotor. Therefore, when the rotor rotates, the center of gravity of the rotor does not essentially move.

Since the center of gravity of the rotor does not essentially move when the rotor moves, reactive forces generated in regions where the piezoelectric/electrostrictive device is secured in position, are small. Therefore, a control process for actuating the rotor and an object joined to the rotor can easily be performed. In addition, the driving frequency at which the rotor and the object are actuated and the response speed for actuating the rotor and the object are high.

The rotor can thus be rotated under highly accurate control. The piezoelectric/electrostrictive device is suitable for use in controlling an actuator for positional control of a hard disk drive (HDD), controlling the angle of a small reflecting mirror, controlling the rotation of an antenna, controlling the θ-axis of an XY stage, and controlling the rotation of a manipulator.

The piezoelectric/electrostrictive device may further comprise a first base having a first fixing member and a first thin plate and a second thin plate which face each other and extend from the first fixing member, and a second base having a second fixing member and a third thin plate and a fourth thin plate which face each other and extend from the second fixing member. The first movable section is provided as an end of the first thin plate or the second thin plate, the second movable section is provided as an end of the third thin plate or the fourth thin plate, the first piezoelectric/electrostrictive element extends over and is fixed to at least the first thin plate or the second thin plate and the first fixing member, and the second piezoelectric/electrostrictive element extends over and is fixed to at least the third thin plate or the fourth thin plate and the second fixing member.

The first piezoelectric/electrostrictive element may be fixed in a region extending from the first thin plate to the first fixing member and a region extending from the second thin plate to the first fixing member, and the second piezoelectric/electrostrictive element may be fixed in a region extending from the third thin plate to the second fixing member and a region extending from the fourth thin plate to the second fixing member.

The rotor may be sandwiched between the first movable section and the second movable section with adhesive layers interposed therebetween. The first fixing member and the second fixing member may be made of ceramics.

The piezoelectric/electrostrictive device may further comprise a frame connected to the first fixing member and the second fixing member. The frame may be made of ceramics or metal.

The first fixing member and the second fixing member may be fixed to a metal plate.

According to the present invention, there is also provided a method of driving the piezoelectric/electrostrictive device referred to above, comprising the step of moving the first movable section and the second movable section respectively in opposite directions.

The first piezoelectric/electrostrictive element is actuated in the direction in which the first movable section is moved, and the second piezoelectric/electrostrictive element is actuated in the direction in which the second movable section is moved.

Since the rotor is substantially in the form of a rectangular parallelepiped and hence has a thickness, the rotor may be twisted as well as rotated depending on the positions where the rotor is fixed to the first movable section and the second movable section. As the direction in which first piezoelectric/electrostrictive element is actuated and the direction in which the second piezoelectric/electrostrictive element is actuated are opposite to each other, the rotor is rotatable about the center of gravity thereof.

Inasmuch as the center of gravity of the rotor does not essentially move when the rotor moves, reactive forces generated in regions where the piezoelectric/electrostrictive device is secured in position, are small. Therefore, a control process for actuating the rotor and an object joined to the rotor can easily be performed. In addition, the driving frequency at which the rotor and the object are actuated and the response speed for actuating the rotor and the object are high.

The rotor can thus be rotated under highly accurate control. The piezoelectric/electrostrictive device is suitable for use in controlling an actuator for positional control of a hard disk drive (HDD), controlling the angle of a small reflecting mirror, controlling the rotation of an antenna, controlling the θ-axis of an XY stage, and controlling the rotation of a manipulator.

With the piezoelectric/electrostrictive device and the method of driving the piezoelectric/electrostrictive device according to the present invention, as described above, the center of gravity of the rotor does not essentially move when the rotor moves. Consequently, reactive forces generated in regions where the piezoelectric/electrostrictive device is secured in position, are small. Therefore, a control process for actuating the rotor and an object joined to the rotor can easily be performed. In addition, the driving frequency at which the rotor and the object are actuated and the response speed for actuating the rotor and the object are high.

The above and other objects, features, and advantages of the present invention will become more apparent from the following description when taken in conjunction with the accompanying drawings in which preferred embodiments of the present invention are shown by way of illustrative example.

DETAILED DESCRIPTION OF THE INVENTION

Piezoelectric/electrostrictive devices according to embodiments of the present invention and methods of driving such piezoelectric/electrostrictive devices will be described below with reference to FIGS. 1 through 7C.

Like or corresponding parts are denoted by like or corresponding reference characters throughout views.

A piezoelectric/electrostrictive device according to the present invention refers to a concept including a device for converting an electric energy to a mechanical energy and vice versa with a piezoelectric/electrostrictive element. Preferably, the piezoelectric/electrostrictive device is used as an active device such as any of various actuators and vibrators, particularly as a displacement device utilizing displacement based on an inverse piezoelectric effect or an electrostrictive effect, and also a passive device such as an acceleration sensor, an impact sensor, or the like.

Figure 1:
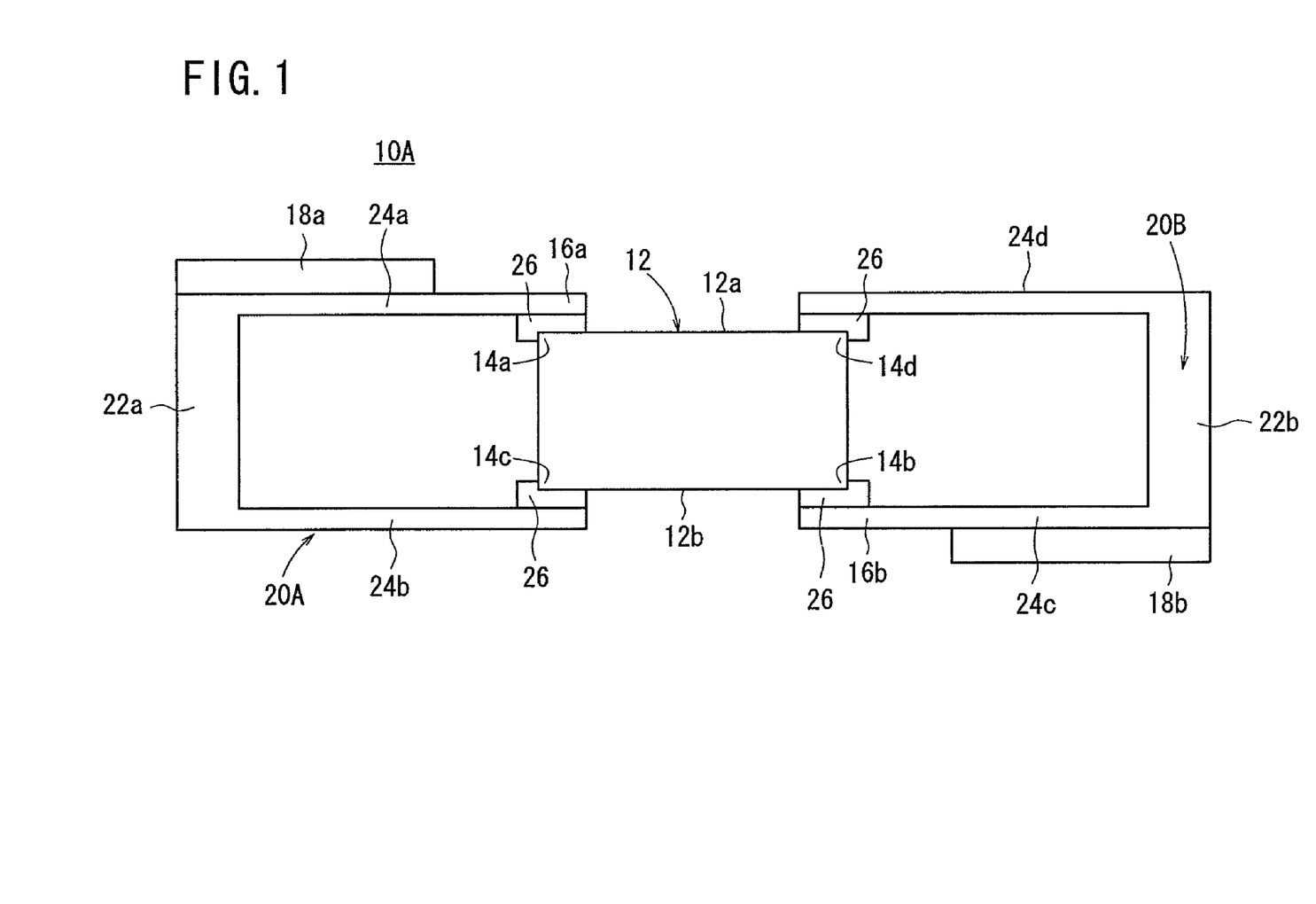
FIG. 1 is a plan view of a piezoelectric/electrostrictive device according to a first embodiment of the present invention.

As shown in FIG. 1, a piezoelectric/electrostrictive device 10A according to a first embodiment of the present invention comprises a rotor 12 substantially in the form of a rectangular parallelepiped, the rotor 12 having a pair of opposite surfaces 12a, 12b, a first movable section 16a fixed to a first end 14a of the surface 12a, a first piezoelectric/electrostrictive element 18a for actuating the first movable section 16a, a second movable section 16b fixed to a second end 14b of the other surface 12b, the second end 14b being diametrically opposite to the first end 14a, and a second piezoelectric/electrostrictive element 18b for actuating the second movable section 16b.

The piezoelectric/electrostrictive device 10A has a first base 20A and a second base 20B.

The first base 20A has a first fixing member 22a and a first thin plate 24a and a second thin plate 24b which face each other and extend from the first fixing member 22a. The second base 20B has a second fixing member 22b and a third thin plate 24c and a fourth thin plate 24d which face each other and extend from the second fixing member 22b.

The first movable section 16a is provided as the end of the first thin plate 24a which is remote from the first fixing member 22a. The second movable section 16b is provided as the end of the third thin plate 24c which is remote from the second fixing member 22b. The first piezoelectric/electrostrictive element 18a extends over and is fixed to the first thin plate 24a and the first fixing member 22a, and the second piezoelectric/electrostrictive element 18b extends over and is fixed to the third thin plate 24c and the second fixing member 22b.

The first end 14a of the rotor 12 and the first movable section 16a of the first base 20A are fixed to each other by an adhesive layer 26, and the second end 14b of the rotor 12 and the second movable section 16b of the second base 20B are fixed to each other by an adhesive layer 26. Other ends of the rotor 12, i.e., a third end 14c and a fourth end 14d, may not be fixed to the second thin plate 24b and the fourth thin plate 24d, respectively. Preferably, however, as shown in FIG. 1, the third end 14c and the fourth end 14d are fixed to the second thin plate 24b and the fourth thin plate 24d, respectively, by respective adhesive layers 26 to ensure the strength.

Figure 2A:
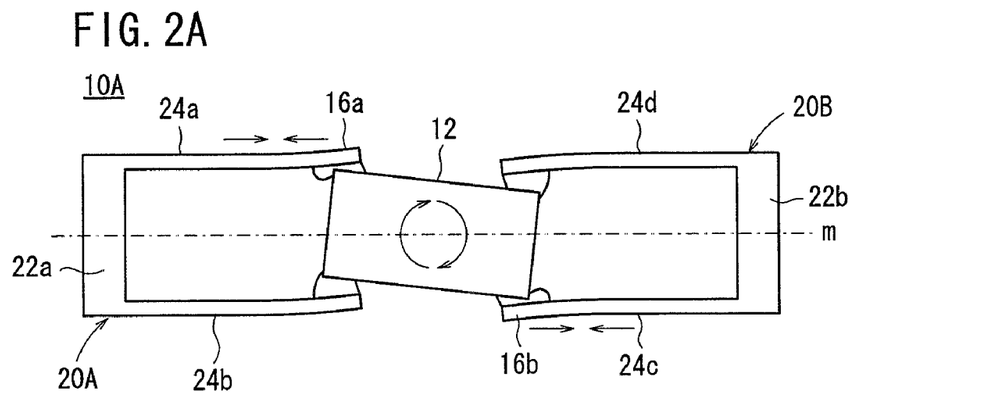
FIGS. 2A through 2C are plan views illustrative of the manner in which the piezoelectric/electrostrictive device according to the first embodiment operates.
Figure 2B:
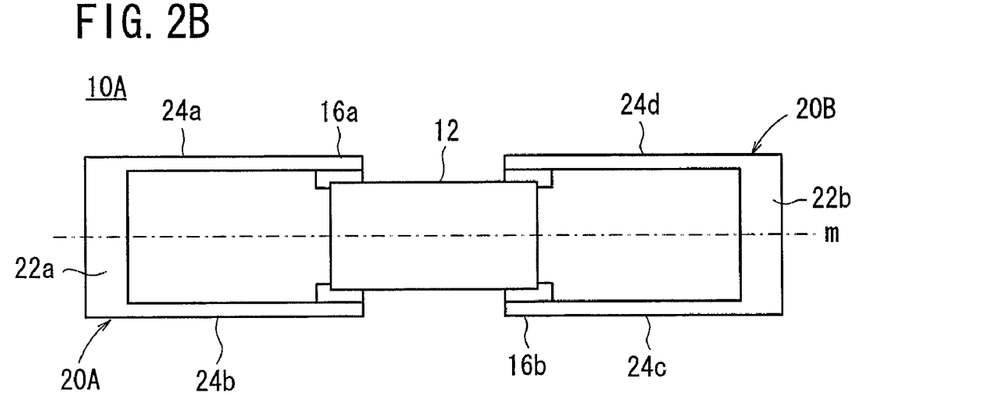
Figure 2C:
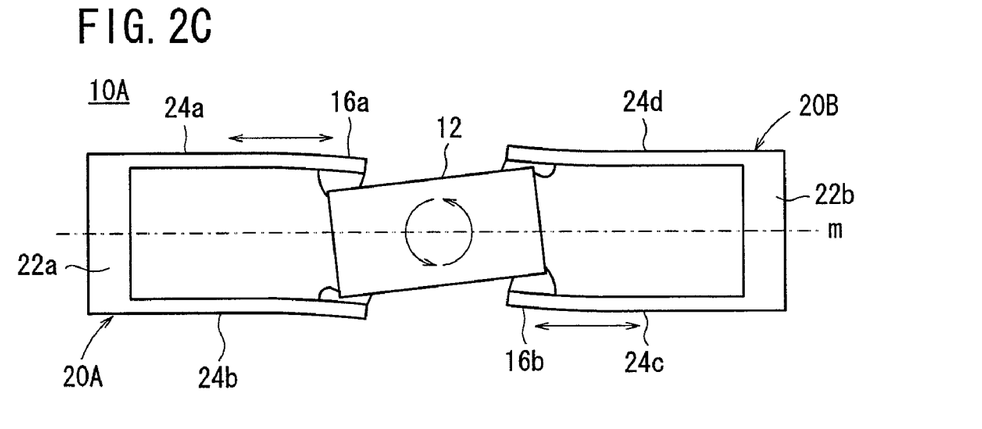

A method of driving the piezoelectric/electrostrictive device 10A according to the first embodiment will be described below with reference to FIGS. 2A through 2C. In FIGS. 2A through 2C, the first piezoelectric/electrostrictive element 18a and the second piezoelectric/electrostrictive element 18b are omitted from illustration for ease of explanation.

When no electric field is applied to the first piezoelectric/electrostrictive element 18a and the second piezoelectric/electrostrictive element 18b (see FIG. 1), the rotor 12 has its longer sides lying parallel to a reference line m which interconnects the center of the first fixing member 22a and the center of the second fixing member 22b, as shown in FIG. 2B.

When electric fields in one direction, e.g., electric fields in a positive direction, are applied respectively to the first piezoelectric/electrostrictive element 18a and the second piezoelectric/electrostrictive element 18b (see FIG. 1) placed in the position shown in FIG. 2B, compressive strains (indicated by "→ ←") are generated in the first piezoelectric/electrostrictive element 18a and the second piezoelectric/electrostrictive element 18b as shown in FIG. 2A. Therefore, the first movable section 16a and the second movable section 16b are moved respectively in opposite directions, i.e., are moved away from each other. Specifically, the first movable section 16a and the second movable section 16b are moved outwardly such that the first movable section 16a is moved in a direction away from the second thin plate 24b and the second movable section 16b is moved in a direction away from the fourth thin plate 24d. The outward movement of the first movable section 16a and the second movable section 16b causes the rotor 12 to rotate in one direction.

Conversely, when electric fields in the opposite direction, e.g., electric fields in a negative direction, are applied respectively to the first piezoelectric/electrostrictive element 18a and the second piezoelectric/electrostrictive element 18b placed in the position shown in FIG. 2B, tensile strains (indicated by "→ ←") are generated in the first piezoelectric/electrostrictive element 18a and the second piezoelectric/electrostrictive element 18b as shown in FIG. 2C. Therefore, the first movable section 16a and the second movable section 16b are moved respectively in opposite directions, i.e., are moved toward each other. Specifically, the first movable section 16a and the second movable section 16b are moved inwardly such that the first movable section 16a is moved in a direction toward the second thin plate 24b and the second movable section 16b is moved in a direction toward the fourth thin plate 24d. The inward movement of the first movable section 16a and the second movable section 16b causes the rotor 12 to rotate in the opposite direction.

With the piezoelectric/electrostrictive device 10A according to the first embodiment, the first movable section 16a and the second movable section 16b sandwich the rotor 12 therebetween, and are actuated respectively by the first piezoelectric/electrostrictive element 18a and the second piezoelectric/electrostrictive element 18b to rotate the rotor 12.

Particularly, since the first movable section 16a is fixed to the first end 14a of the surface 12a of the rotor 12 and the second movable section 16b is fixed to the second end 14b, which is diametrically opposite to the first end 14a, of the surface 12b of the rotor 12, the center of gravity of the rotor 12 does not essentially move while the rotor 12 is rotating.

According to the first embodiment, because the center of gravity of the rotor 12 does not essentially move when the rotor 12 and an object joined to the rotor 21 are moved, reactive forces generated in regions, i.e., the first fixing member 22a and the second fixing member 22b, where the piezoelectric/electrostrictive device 10A is secured in position, are small. Therefore, a control process for actuating the rotor 12 and the object can easily be performed. In addition, the driving frequency at which the rotor 12 and the object are actuated and the response speed for actuating the rotor 12 and the object are high.

Accordingly, the rotor 12 and the object can be rotated under highly accurate control. The piezoelectric/electrostrictive device 10A can preferably be used in controlling an actuator for positional control of a hard disk drive (HDD), controlling the angle of a small reflecting mirror, controlling the rotation of an antenna, controlling the θ-axis of an XY stage, and controlling the rotation of a manipulator. An actuator which incorporates the piezoelectric/electrostrictive device 10A may be combined with another actuator for producing more complex motions.

Specific preferable details of the various components of the piezoelectric/electrostrictive device 10A will be described below.

The first base 20A and the second base 20B may be made of ceramics, e.g., zirconia, or metal.

If the first base 20A and the second base 20B are made of metal, then they are highly resistant to impacts.

If the first base 20A and the second base 20B are made of ceramics, then the positional accuracy of the piezoelectric/electrostrictive device 10A is high when the piezoelectric/electrostrictive device 10A is installed in position. Another advantage is that the maximum angular displacement of the rotor 12 which is produced at a predetermined drive voltage becomes even.

A slider, a sensor, a stage, or the like may be mounted on the rotor 12, or the rotor 12 itself may be a slider, a stage, or the like.

The first thin plate 24a, the second thin plate 24b, the third thin plate 24c, and the fourth thin plate 24d are basically of the same material as the first base 20A and the second base 20B, i.e., the first fixing member 22a and the second fixing member 22b. However, the first thin plate 24a, the second thin plate 24b, the third thin plate 24c, and the fourth thin plate 24d may be made of a material different from the first base 20A and the second base 20B. For example, the first thin plate 24a, the second thin plate 24b, the third thin plate 24c, and the fourth thin plate 24d may be made of a piezoelectric/electrostrictive material.

Each of the first piezoelectric/electrostrictive element 18a and the second piezoelectric/electrostrictive element 18b comprises a pair of an electrode layer and a piezoelectric layer. The piezoelectric layer may be a single layer of a multiplicity of layers.

The first piezoelectric/electrostrictive element 18a is fixed to the first thin plate 24a, and the second piezoelectric/electrostrictive element 18b is fixed to the third thin plate 24c. If the first thin plate 24a and the third thin plate 24c are made of ceramics, then the first piezoelectric/electrostrictive element 18a and the first thin plate 24a are secured to each other by sintering, and the second piezoelectric/electrostrictive element 18b and the third thin plate 24c are also secured to each other by sintering.

If the first thin plate 24a and the third thin plate 24c are made of metal, then the first piezoelectric/electrostrictive element 18a and the first thin plate 24a are secured to each other by adhesive bonding, and the second piezoelectric/electrostrictive element 18b and the third thin plate 24c are also secured to each other by adhesive bonding.

Figure 3:
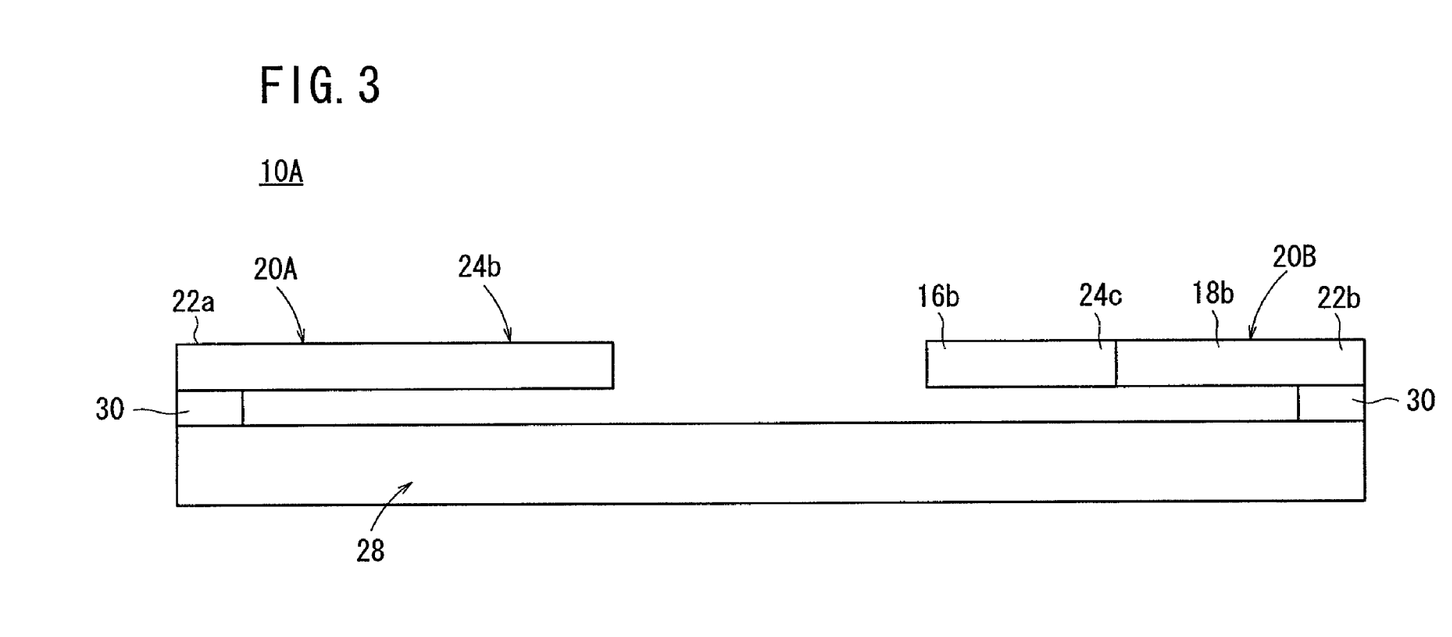
FIG. 3 is a side elevation view of the piezoelectric/electrostrictive device according to the first embodiment, the view showing a first base and a second base which are connected to each other by a frame.

As shown in FIG. 3, the first base 20A and the second base 20B may be joined to each other by a frame 28. The first base 20A and the second base 20B which are joined to each other by the frame 28 are positioned with high relative positional accuracy. Preferably, the frame 28 is secured to a principal surface of the first fixing member 22a and a principal surface of the second fixing member 22b by spacers 30 interposed therebetween.

If the first base 20A, the second base 20B, the spacers 30, and the frame 28 are made of ceramics, then the first base 20A, the second base 20B, the spacers 30, and the frame 28 may be constructed as a unitary sintered body. If the frame 28 is made of metal, then the spacers 30 may be made of an organic adhesive. In FIG. 3, the rotor 12 is omitted from illustration.

The first fixing member 22a and the second fixing member 22b may be bonded to metal plates such as suspensions.

A piezoelectric/electrostrictive device 10B according to a second embodiment of the present invention will be described below with reference to FIGS. 4 and 5A through 5C. In FIGS. 4 and 5A through 5C, the first piezoelectric/electrostrictive element 18a and the second piezoelectric/electrostrictive element 18b are omitted from illustration.

Figure 4:
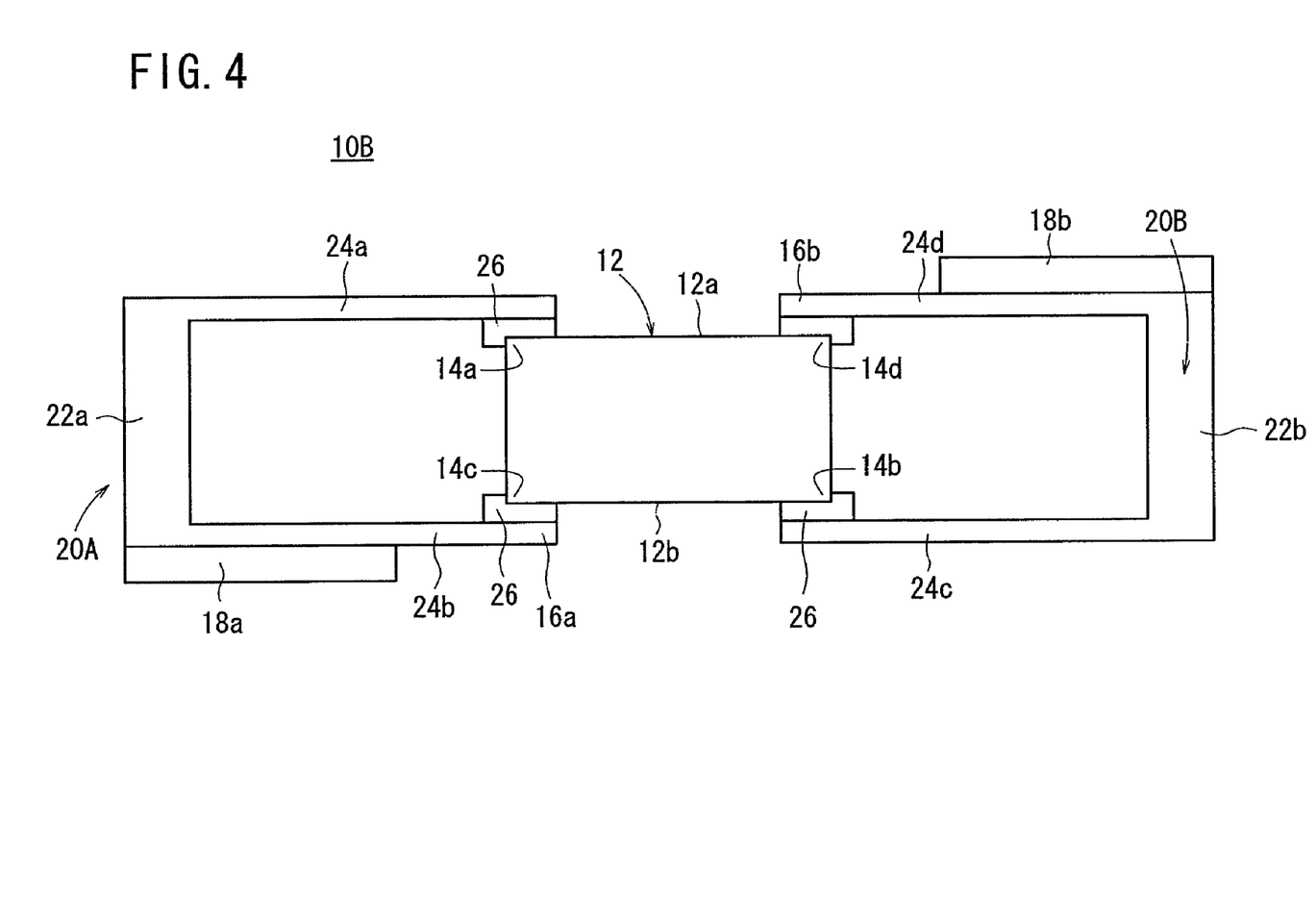
FIG. 4 is a plan view of a piezoelectric/electrostrictive device according to a second embodiment of the present invention.

As shown in FIG. 4, the piezoelectric/electrostrictive device 10B according to the second embodiment is of substantially the same structure as the piezoelectric/electrostrictive device 10A according to the first embodiment, except as follows:

The first movable section 16a is provided as the end of the second thin plate 24b which is remote from the first fixing member 22a. The second movable section 16b is provided as the end of the fourth thin plate 24d which is remote from the second fixing member 22b. The first piezoelectric/electrostrictive element 18a extends over and is fixed to the second thin plate 24b and the first fixing member 22a, and the second piezoelectric/electrostrictive element 18b extends over and is fixed to the fourth thin plate 24d and the second fixing member 22b.

A method of driving the piezoelectric/electrostrictive device 10B according to the second embodiment will be described below with reference to FIGS. 5A through 5C.

Figure 5A:
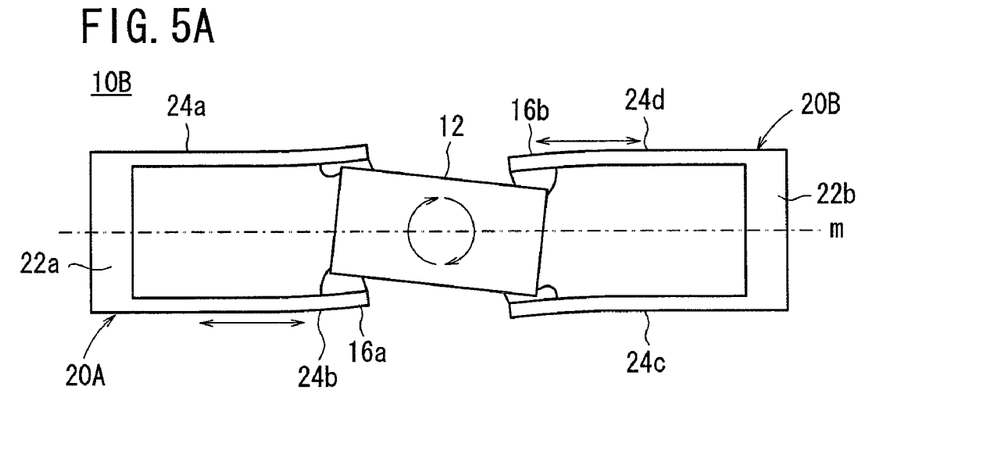
FIGS. 5A through 5C are plan views illustrative of the manner in which the piezoelectric/electrostrictive device according to the second embodiment operates.
Figure 5B:
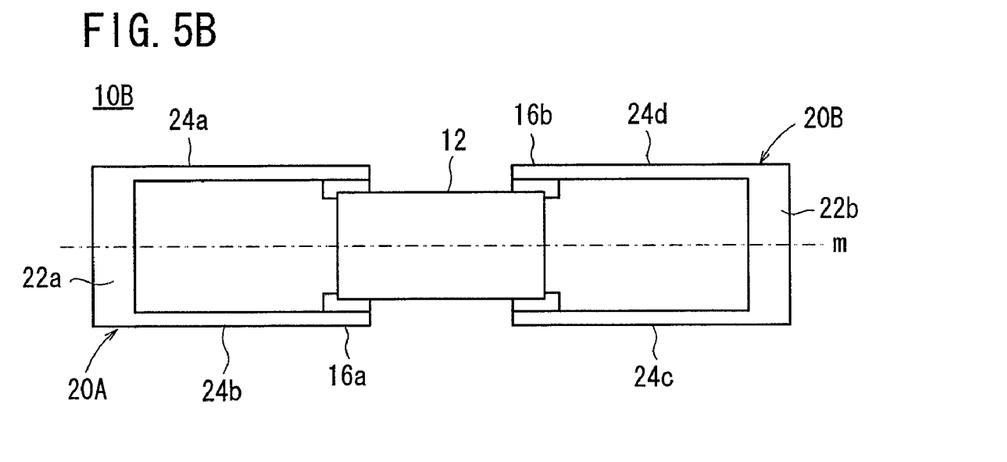

When no electric field is applied to the first piezoelectric/electrostrictive element 18a and the second piezoelectric/electrostrictive element 18b (see FIG. 4), the rotor 12 has its longer sides lying parallel to the reference line m, as shown in FIG. 5B.

When electric fields in the opposite direction, e.g., electric fields in a negative direction, are applied respectively to the first piezoelectric/electrostrictive element 18a and the second piezoelectric/electrostrictive element 18b placed in the position shown in FIG. 5B, tensile strains (indicated by "→ ←") are generated in the first piezoelectric/electrostrictive element 18a and the second piezoelectric/electrostrictive element 18b as shown in FIG. 5A. Therefore, the first movable section 16a and the second movable section 16b are moved inwardly such that the first movable section 16a is moved in a direction toward the first thin plate 24a and the second movable section 16b is moved in a direction toward the third thin plate 24c. The inward movement of the first movable section 16a and the second movable section 16b causes the rotor 12 to rotate in one direction.

Figure 5C:
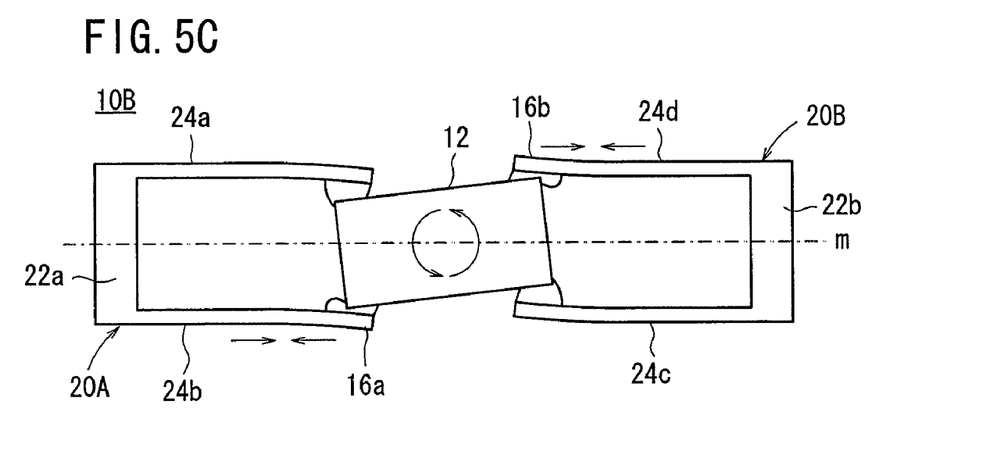

Conversely, when electric fields in one direction, e.g., electric fields in a positive direction, are applied respectively to the first piezoelectric/electrostrictive element 18a and the second piezoelectric/electrostrictive element 18b placed in the position shown in FIG. 5B, compressive strains (indicated by "→ ←") are generated in the first piezoelectric/electrostrictive element 18a and the second piezoelectric/electrostrictive element 18b as shown in FIG. 5C. Therefore, the first movable section 16a and the second movable section 16b are moved outwardly such that the first movable section 16a is moved in a direction away from the first thin plate 24a and the second movable section 16b is moved in a direction away from the third thin plate 24c. The outward movement of the first movable section 16a and the second movable section 16b causes the rotor 12 to rotate in the opposite direction.

According to the second embodiment, because the center of gravity of the rotor 12 does not essentially move when the rotor 12 and an object joined to the rotor 21 are moved, reactive forces generated in regions, i.e., the first fixing member 22a and the second fixing member 22b, where the piezoelectric/electrostrictive device 10B is secured in position, are small. Therefore, a control process for actuating the rotor 12 and the object can easily be performed. In addition, the driving frequency at which the rotor 12 and the object are actuated and the response speed for actuating the rotor 12 and the object are high.

A piezoelectric/electrostrictive device 10C according to a third embodiment of the present invention will be described below with reference to FIGS. 6 and 7A through 7C. In FIGS. 7A through 7C, the first through fourth piezoelectric/electrostrictive elements 18a through 18d are omitted from illustration.

Figure 6:
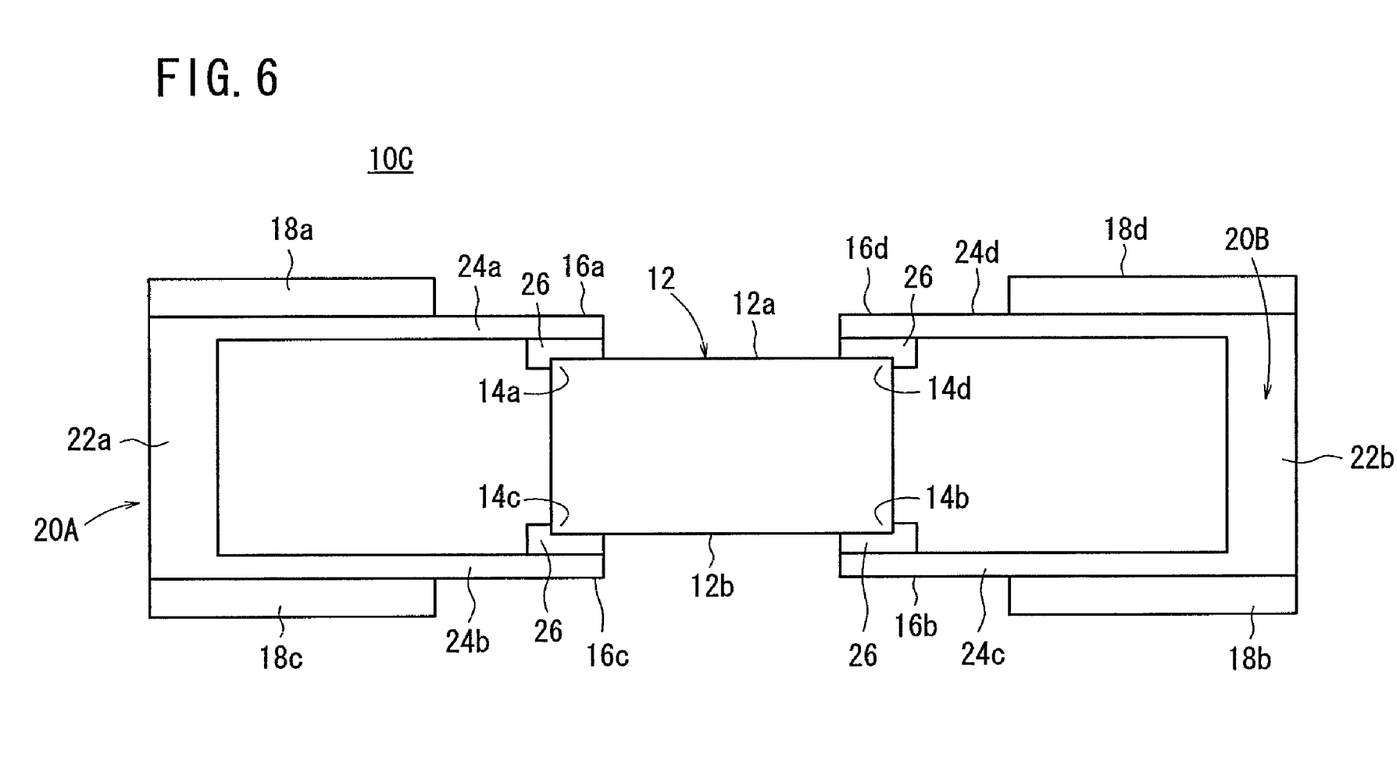
FIG. 6 is a plan view of a piezoelectric/electrostrictive device according to a third embodiment of the present invention.
Figure 7A:
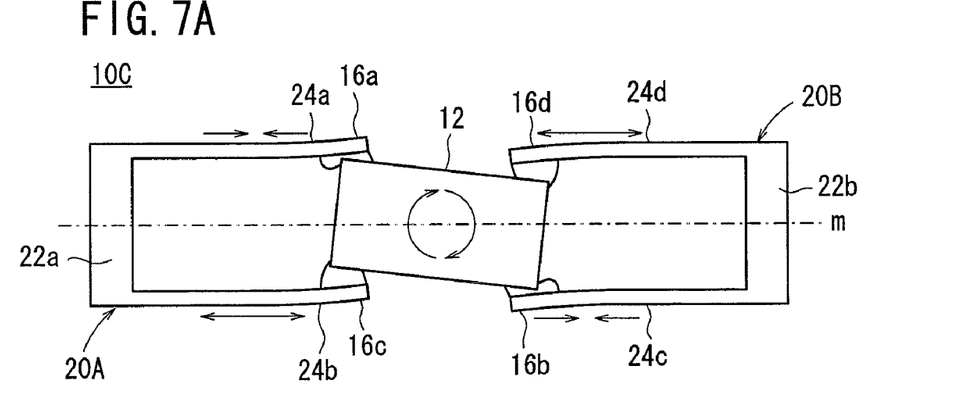
FIGS. 7A through 7C are plan views illustrative of the manner in which the piezoelectric/electrostrictive device according to the third embodiment operates.
Figure 7B:
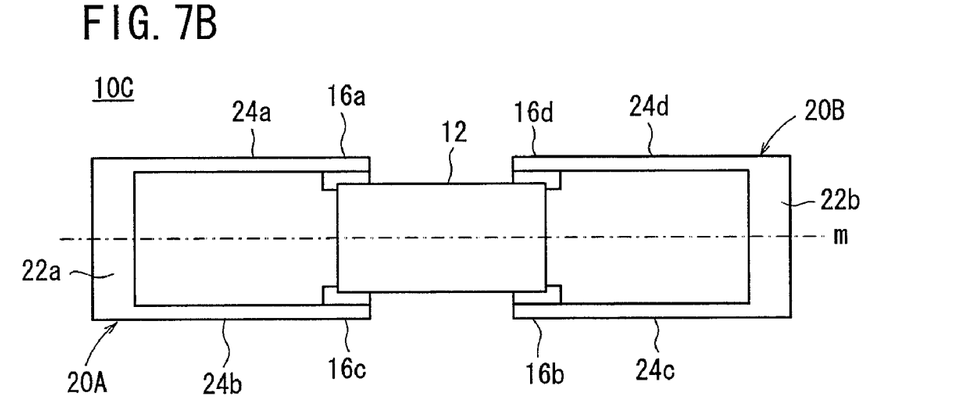
Figure 7C:
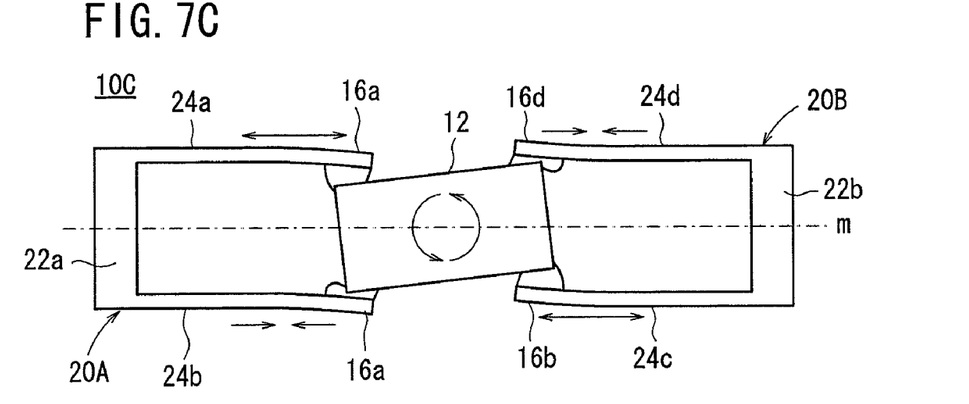

As shown in FIG. 6, the piezoelectric/electrostrictive device 10C according to the third embodiment is of a structure which is a combination of the piezoelectric/electrostrictive device 10A according to the first embodiment and the piezoelectric/electrostrictive device 10B according to the second embodiment.

As with the first embodiment, the piezoelectric/electrostrictive device 10C according to the third embodiment has the first movable section 16a fixed to the first end 14a of the surface 12a, the first piezoelectric/electrostrictive element 18a for actuating the first movable section 16a, the second movable section 16b fixed to the second end 14b of the other surface 12b, the second end 14b being diametrically opposite to the first end 14a, and the second piezoelectric/electrostrictive element 18b for actuating the second movable section 16b.

The piezoelectric/electrostrictive device 10C also has a third movable section 16c fixed to the third end 14c of the surface 12a, a third piezoelectric/electrostrictive element 18c for actuating the third movable section 16c, a fourth movable section 16d fixed to the fourth end 14d of the other surface 12b, the fourth end 14d being diametrically opposite to the third end 14c, and a fourth piezoelectric/electrostrictive element 18d for actuating the fourth movable section 16d.

As with the first embodiment, the first piezoelectric/electrostrictive element 18a extends over and is fixed to the first thin plate 24a and the first fixing member 22a, and the second piezoelectric/electrostrictive element 18b extends over and is fixed to the third thin plate 24c and the second fixing member 22b.

Similarly, the third piezoelectric/electrostrictive element 18c extends over and is fixed to the second thin plate 24b and the first fixing member 22a, and the fourth piezoelectric/electrostrictive element 18d extends over and is fixed to the fourth thin plate 24d and the second fixing member 22b.

A method of driving the piezoelectric/electrostrictive device 10C according to the third embodiment will be described below with reference to FIGS. 7A through 7C.

When no electric field is applied to the first through fourth piezoelectric/electrostrictive elements 18a through 18d (see FIG. 6), the rotor 12 has its longer sides lying parallel to the reference line m, as shown in FIG. 7B.

When electric fields in one direction, e.g., electric fields in a positive direction, are applied respectively to the first piezoelectric/electrostrictive element 18a and the second piezoelectric/electrostrictive element 18b placed in the position shown in FIG. 7B, and electric fields in the opposite direction, e.g., electric fields in a negative direction, are applied respectively to the third piezoelectric/electrostrictive element 18c and the fourth piezoelectric/electrostrictive element 18d placed in the position shown in FIG. 7B, compressive strains (indicated by "→ ←") are generated in the first piezoelectric/electrostrictive element 18a and the second piezoelectric/electrostrictive element 18b, and tensile strains (indicated by "→ ←") are generated in the third piezoelectric/electrostrictive element 18c and the fourth piezoelectric/electrostrictive element 18d as shown in FIG. 7A.

Therefore, the first movable section 16a and the second movable section 16b are moved outwardly and the third movable section 16c and the fourth movable section 16d are moved inwardly. Specifically, the first movable section 16a is moved in a direction away from the second thin plate 24b, the second movable section 16b is moved in a direction away from the fourth thin plate 24d, the third movable section 16c is moved in a direction toward the first thin plate 24a, and the fourth movable section 16d is moved in a direction toward the third thin plate 24c. The outward movement of the first movable section 16a and the second movable section 16b and the inward movement of the third movable section 16c and the fourth movable section 16d cause the rotor 12 to rotate in one direction.

Conversely, when electric fields in the opposite direction, e.g., electric fields in a negative direction, are applied respectively to the first piezoelectric/electrostrictive element 18a and the second piezoelectric/electrostrictive element 18b placed in the position shown in FIG. 7B, and electric fields in one direction, e.g., electric fields in a positive direction, are applied respectively to the third piezoelectric/electrostrictive element 18c and the fourth piezoelectric/electrostrictive element 18d placed in the position shown in FIG. 7B, tensile strains (indicated by "→ ←") are generated in the first piezoelectric/electrostrictive element 18a and the second piezoelectric/electrostrictive element 18b, and compressive strains (indicated by "→ ←") are generated in the third piezoelectric/electrostrictive element 18c and the fourth piezoelectric/electrostrictive element 18d as shown in FIG. 7C.

Therefore, the first movable section 16a and the second movable section 16b are moved inwardly and the third movable section 16c and the fourth movable section 16d are moved outwardly. Specifically, the first movable section 16a is moved in a direction toward the second thin plate 24b, the second movable section 16b is moved in a direction toward the fourth thin plate 24d, the third movable section 16c is moved in a direction away from the first thin plate 24a, and the fourth movable plate 16d is moved in a direction away from the third thin plate 24c. The inward movement of the first movable section 16a and the second movable section 16b and the outward movement of the third movable section 16c and the fourth movable section 16d cause the rotor 12 to rotate in the opposite direction.

According to the third embodiment, because the center of gravity of the rotor 12 does not essentially move when the rotor 12 and an object joined to the rotor 21 are moved, reactive forces generated in regions, i.e., the first fixing member 22a and the second fixing member 22b, where the piezoelectric/electrostrictive device 10C is secured in position, are small. Therefore, a control process for actuating the rotor 12 and the object can easily be performed. In addition, the driving frequency at which the rotor 12 and the object are actuated and the response speed for actuating the rotor 12 and the object are high.

According to the third embodiment, particularly, since the rotor 12 is rotated by the first through fourth piezoelectric/electrostrictive elements 18a through 18d, the dynamic range of a voltage applied to the first through fourth piezoelectric/electrostrictive elements 18a through 18d may be small, and hence the burden on the circuit for driving the piezoelectric/electrostrictive device 10C may be small.

With the piezoelectric/electrostrictive device 10C according to the third embodiment, the rotor 12 is rotated by a combination of tensile and compressive strains generated in the first through fourth piezoelectric/electrostrictive elements 18a through 18d. However, the combination of tensile and compressive strains generated in the first through fourth piezoelectric/electrostrictive elements 18a through 18d is not essential for rotating the rotor 12. Instead, the rotor 12 may be rotated by only tensile strains or compressive strains. In particular, it is preferable to rotate the rotor 12 with only compressive strains generated in the first through fourth piezoelectric/electrostrictive elements 18a through 18d.

Although certain preferred embodiments of the present invention have been described above, it should be understood that various changes and modifications may be made therein without departing the scope of the attached claims.

What is claimed is:

1. A piezoelectric/electrostrictive device comprising:
    a rotor substantially in the form of a rectangular parallelepiped, said rotor having a pair of opposed surfaces;
    a first movable section fixed to a first end of one of said surfaces;
    a first piezoelectric/electrostrictive element for actuating said first movable section;
    a second movable section fixed to a second end of the other one of said surfaces, said second end being diametrically opposed to said first end;
    a second piezoelectric/electrostrictive element for actuating said second movable section;
    a first base having a first fixing member and a first thin plate and a second thin plate which face each other and extend from said first fixing member; and a second base having a second fixing member and a third thin plate and a fourth thin plate which face each other and extend from said second fixing member;

wherein said first movable section is provided as an end of said first thin plate or said second thin plate of said first base;

wherein said second movable section is provided as an end of said third thin plate or said fourth thin plate of said second base;

wherein said first piezoelectric/electrostrictive element extends over and is fixed to at least one of said first thin plate and said second thin plate and said first fixing member; and wherein said second piezoelectric/electrostrictive element extends over and is fixed to at least one of said third thin plate and said fourth thin plate and said second fixing member.

2. The piezoelectric/electrostrictive device according to claim 1, further comprising:

a third piezoelectric/electrostrictive element for actuating a third movable section; and a fourth piezoelectric/electrostrictive element for actuating a fourth movable section;

wherein said first piezoelectric/electrostrictive element is fixed in a region extending from said first thin plate to said first fixing member;

wherein said third piezoelectric/electrostrictive element is fixed in a region extending from said second thin plate to said first fixing member;

wherein said second piezoelectric/electrostrictive element is fixed in a region extending from said third thin plate to said second fixing member;and wherein said fourth piezoelectric/electrostrictive element is fixed in a region extending from said fourth thin plate to said second fixing member.

3. The piezoelectric/electrostrictive device according to claim 1, wherein said rotor is sandwiched between said first movable section and said second movable section with adhesive layers interposed therebetween.

4. The piezoelectric/electrostrictive device according to claim 1, wherein said first fixing member and said second fixing member are made of ceramics.

5. The piezoelectric/electrostrictive device according to claim 1, further comprising a frame connected to said first fixing member and said second fixing member.

6. The piezoelectric/electrostrictive device according to claim 5, wherein said frame is made of ceramics.

7. The piezoelectric/electrostrictive device according to claim 5, wherein said frame is made of metal.

8. The piezoelectric/electrostrictive device according to claim 1, wherein said first fixing member and said second fixing member are fixed to a metal plate.

* * * * *